(12) United States Patent
Kim et al.

(10) Patent No.: US 7,934,144 B2
(45) Date of Patent: Apr. 26, 2011

(54) HIGH-SPEED ANALOG-TO-DIGITAL CONVERSION WITH IMPROVED ROBUSTNESS TO TIMING UNCERTAINTY

(75) Inventors: Andrew Joo Kim, Atlanta, GA (US); Stephen E. Ralph, Atlanta, GA (US); Sanjay Bajekal, Marietta, GA (US)

(73) Assignee: Quellan, Inc., Atlanta, GA (US)

( * ) Notice: Subject to any disclaimer, the term of this patent is extended or adjusted under 35 U.S.C. 154(b) by 2295 days.

(21) Appl. No.: 10/706,187

(22) Filed: Nov. 12, 2003

(65) Prior Publication Data

US 2004/0105462 A1 Jun. 3, 2004

Related U.S. Application Data

(60) Provisional application No. 60/425,985, filed on Nov. 12, 2002.

(51) Int. Cl.
*H03M 13/00* (2006.01)

(52) U.S. Cl. ......... 714/780; 375/317; 375/341; 375/355

(58) Field of Classification Search .................. 375/317, 375/341; 714/780
See application file for complete search history.

(56) References Cited

U.S. PATENT DOCUMENTS

| | | | |
|---|---|---|---|
| 2,632,058 A | 3/1953 | Gray | |
| 3,445,771 A | 5/1969 | Clapham et al. | |
| 3,571,725 A | 3/1971 | Kaneko et al. | |
| 3,599,122 A | 8/1971 | Leuthoki | 333/29 |
| 3,633,108 A | 1/1972 | Kneuer | 325/323 |
| 3,714,437 A | 1/1973 | Kinsel | |
| 3,806,915 A | 4/1974 | Higgins et al. | |
| 3,977,795 A | 8/1976 | Buschmann | |
| 4,201,909 A | 5/1980 | Dogliotti et al. | 455/608 |
| 4,287,756 A | 9/1981 | Gallagher | |
| 4,288,872 A | 9/1981 | Tamburelli | 375/14 |
| 4,349,914 A | 9/1982 | Evans | |
| 4,363,127 A | 12/1982 | Evans et al. | |
| 4,386,339 A | 5/1983 | Henry et al. | |
| 4,387,461 A | 6/1983 | Evans | |
| 4,393,499 A | 7/1983 | Evans | |
| 4,410,878 A | 10/1983 | Stach | 340/347 |
| 4,464,771 A | 8/1984 | Sorensen | |

(Continued)

FOREIGN PATENT DOCUMENTS

EP 0 527 966 B1 9/1994

(Continued)

OTHER PUBLICATIONS

Kannangara et al.; *Adaptive Duplexer for Multiband Transreceiver*; Radio and Wireless Conference; Aug. 10-13, 2003; RAWCON '03; pp. 381-384.

(Continued)

*Primary Examiner* — Sam Rizk
(74) *Attorney, Agent, or Firm* — King & Spalding

(57) ABSTRACT

A method and system using the principle of generalized maximum likelihood estimation to resolve sample timing uncertainties that are associated with the decoding of communication signals. By using generalized maximum likelihood estimation, sample timing uncertainty can be resolved by taking multiple samples of the received signal within a symbol period and determining which sample best corresponds to the optimal sample timing. The sample which best corresponds to the optimal sample timing can be determined from a timing index which can be calculated from ambiguity indicators that are based on the samples of the received signal.

19 Claims, 4 Drawing Sheets

U.S. PATENT DOCUMENTS

| | | | |
|---|---|---|---|
| 4,470,126 A | 9/1984 | Haque | |
| 4,475,227 A | 10/1984 | Belfield | 381/30 |
| 4,479,266 A | 10/1984 | Eumurian et al. | |
| 4,521,883 A | 6/1985 | Roché | |
| 4,580,263 A | 4/1986 | Watanabe et al. | |
| 4,584,720 A | 4/1986 | Garrett | |
| 4,618,941 A | 10/1986 | Linder et al. | |
| 4,646,173 A | 2/1987 | Kammeyer et al. | 360/51 |
| 4,651,026 A | 3/1987 | Serfaty et al. | |
| 4,751,497 A | 6/1988 | Torii | |
| 4,830,493 A | 5/1989 | Giebeler | |
| 4,847,521 A | 7/1989 | Huignard et al. | |
| 4,864,590 A | 9/1989 | Arnon et al. | |
| 4,873,700 A | 10/1989 | Wong | 375/76 |
| 4,912,726 A | 3/1990 | Iwamatsu et al. | |
| 4,942,593 A | 7/1990 | Whiteside et al. | |
| 4,953,041 A | 8/1990 | Huber | 360/46 |
| 4,959,535 A | 9/1990 | Garrett | |
| 4,978,957 A | 12/1990 | Hotta et al. | |
| 5,007,106 A | 4/1991 | Kahn et al. | |
| 5,008,957 A | 4/1991 | Klyono | |
| 5,012,475 A | 4/1991 | Campbell | |
| 5,067,126 A | 11/1991 | Moore | |
| 5,072,221 A | 12/1991 | Schmidt | |
| 5,111,065 A | 5/1992 | Roberge | |
| 5,113,278 A | 5/1992 | Degura et al. | |
| 5,115,450 A | 5/1992 | Arcuri | |
| 5,121,411 A | 6/1992 | Fluharty | |
| 5,128,790 A | 7/1992 | Heidemann et al. | |
| 5,132,639 A | 7/1992 | Blauvelt et al. | |
| 5,151,698 A | 9/1992 | Pophillat | |
| 5,181,034 A | 1/1993 | Takakura et al. | |
| 5,181,136 A | 1/1993 | Kavehrad et al. | |
| 5,184,131 A | 2/1993 | Ikeda | |
| 5,208,833 A | 5/1993 | Erhart et al. | |
| 5,222,103 A | 6/1993 | Gross | |
| 5,223,834 A | 6/1993 | Wang et al. | |
| 5,225,798 A | 7/1993 | Hunsinger et al. | |
| 5,237,590 A | 8/1993 | Kazawa et al. | |
| 5,243,613 A | 9/1993 | Gysel et al. | |
| 5,252,930 A | 10/1993 | Blauvelt | |
| 5,282,072 A | 1/1994 | Nazarathy et al. | |
| 5,283,679 A | 2/1994 | Wedding | |
| 5,291,031 A | 3/1994 | MacDonald et al. | |
| 5,293,406 A | 3/1994 | Suzuki | |
| 5,300,930 A | 4/1994 | Burger et al. | |
| 5,321,543 A | 6/1994 | Huber | |
| 5,321,710 A | 6/1994 | Cornish et al. | |
| 5,327,279 A | 7/1994 | Farina et al. | |
| 5,343,322 A | 8/1994 | Pirio et al. | |
| 5,351,148 A | 9/1994 | Maeda et al. | |
| 5,355,240 A | 10/1994 | Prigent et al. | |
| 5,361,156 A | 11/1994 | Pidgeon | |
| 5,371,625 A | 12/1994 | Wedding et al. | |
| 5,373,384 A | 12/1994 | Hebert | |
| 5,376,786 A | 12/1994 | MacDonald | |
| 5,382,955 A | 1/1995 | Knierim | |
| 5,387,887 A | 2/1995 | Zimmerman et al. | |
| 5,408,485 A | 4/1995 | Ries | |
| 5,413,047 A | 5/1995 | Evans et al. | |
| 5,416,628 A | 5/1995 | Betti et al. | |
| 5,418,637 A | 5/1995 | Kuo | |
| 5,424,680 A | 6/1995 | Nazarathy et al. | |
| 5,428,643 A | 6/1995 | Razzell | |
| 5,428,831 A | 6/1995 | Monzello et al. | 455/296 |
| 5,436,752 A | 7/1995 | Wedding | |
| 5,436,756 A | 7/1995 | Knox et al. | |
| 5,444,864 A | 8/1995 | Smith | 455/84 |
| 5,450,044 A | 9/1995 | Hulick | |
| 5,481,389 A | 1/1996 | Pidgeon et al. | |
| 5,481,568 A | 1/1996 | Yada | |
| 5,483,552 A | 1/1996 | Shimazaki et al. | 375/233 |
| 5,504,633 A | 4/1996 | Van Den Enden | |
| 5,510,919 A | 4/1996 | Wedding | |
| 5,515,196 A | 5/1996 | Kitajima et al. | |
| 5,528,710 A | 6/1996 | Burton et al. | |
| 5,541,955 A | 7/1996 | Jacobsmeyer | 375/222 |
| 5,548,253 A | 8/1996 | Durrant | |
| 5,557,439 A | 9/1996 | Alexander et al. | 359/130 |
| 5,574,743 A | 11/1996 | van der Poel et al. | |
| 5,574,978 A | 11/1996 | Talwar et al. | |
| 5,589,786 A | 12/1996 | Bella et al. | |
| 5,604,724 A | 2/1997 | Shiokawa | |
| 5,606,734 A | 2/1997 | Bahu | 455/303 |
| 5,612,653 A | 3/1997 | Dodds et al. | |
| 5,617,135 A | 4/1997 | Noda et al. | 348/12 |
| 5,621,764 A | 4/1997 | Ushirokawa et al. | |
| 5,625,360 A | 4/1997 | Garrity et al. | |
| 5,625,722 A | 4/1997 | Froberg et al. | |
| 5,644,325 A | 7/1997 | King et al. | |
| 5,648,987 A | 7/1997 | Yang et al. | 375/232 |
| 5,670,871 A | 9/1997 | Man et al. | |
| 5,675,600 A | 10/1997 | Yamamoto | |
| 5,678,198 A | 10/1997 | Lemson | |
| 5,689,356 A | 11/1997 | Rainal | |
| 5,691,978 A | 11/1997 | Kenworthy | 370/278 |
| 5,692,011 A | 11/1997 | Nobakht et al. | 375/233 |
| 5,699,022 A | 12/1997 | Tovar | 333/18 |
| 5,706,008 A | 1/1998 | Huntley, Jr. et al. | |
| 5,721,315 A | 2/1998 | Evans et al. | |
| 5,723,176 A | 3/1998 | Keyworth et al. | |
| 5,751,726 A | 5/1998 | Kim | |
| 5,754,681 A | 5/1998 | Watanabe et al. | |
| 5,757,763 A | 5/1998 | Green et al. | |
| 5,761,243 A | 6/1998 | Russell et al. | |
| 5,764,542 A | 6/1998 | Gaudette et al. | |
| 5,774,505 A | 6/1998 | Baugh | 375/348 |
| 5,783,630 A | 7/1998 | Evans et al. | |
| 5,784,032 A | 7/1998 | Johnston et al. | |
| 5,790,595 A | 8/1998 | Benthin et al. | |
| 5,798,854 A | 8/1998 | Blauvelt et al. | |
| 5,801,657 A | 9/1998 | Fowler et al. | |
| 5,802,089 A | 9/1998 | Link | |
| 5,812,578 A | 9/1998 | Schemmann et al. | |
| 5,825,211 A | 10/1998 | Smith et al. | |
| 5,825,257 A | 10/1998 | Klymyshyn et al. | |
| 5,825,825 A | 10/1998 | Altmann et al. | |
| 5,828,329 A | 10/1998 | Burns | |
| 5,835,848 A | 11/1998 | Bi et al. | 455/24 |
| 5,839,105 A | 11/1998 | Ostendorf et al. | |
| 5,841,841 A | 11/1998 | Dodds et al. | |
| 5,844,436 A | 12/1998 | Altmann | |
| 5,848,139 A | 12/1998 | Grover | |
| 5,850,409 A | 12/1998 | Link | |
| 5,850,505 A | 12/1998 | Grover et al. | |
| 5,852,389 A | 12/1998 | Kumar et al. | |
| 5,859,862 A | 1/1999 | Hikasa et al. | |
| 5,861,966 A | 1/1999 | Ortel | |
| 5,872,468 A | 2/1999 | Dyke | |
| 5,878,390 A | 3/1999 | Kawai et al. | |
| 5,880,870 A | 3/1999 | Sieben et al. | |
| 5,883,910 A | 3/1999 | Link | |
| 5,887,022 A | 3/1999 | Lee et al. | |
| 5,889,759 A | 3/1999 | McGibney | |
| 5,896,392 A | 4/1999 | Ono et al. | |
| 5,912,749 A | 6/1999 | Harstead et al. | |
| 5,920,600 A | 7/1999 | Yamaoka et al. | |
| 5,923,226 A | 7/1999 | Kakura et al. | |
| 5,942,576 A | 8/1999 | Evans et al. | |
| 5,943,380 A | 8/1999 | Marchesani et al. | |
| 5,943,457 A | 8/1999 | Hayward et al. | |
| 5,949,926 A | 9/1999 | Davies | |
| 5,959,032 A | 9/1999 | Evans et al. | |
| 5,959,750 A | 9/1999 | Eskildsen et al. | |
| 5,965,667 A | 10/1999 | Evans et al. | |
| 5,968,198 A | 10/1999 | Hassan et al. | |
| 5,978,417 A | 11/1999 | Baker et al. | 375/232 |
| 5,983,178 A | 11/1999 | Naito et al. | |
| 5,985,999 A | 11/1999 | Dominguez et al. | |
| 5,995,565 A | 11/1999 | Tong et al. | 375/346 |
| 5,999,300 A | 12/1999 | Davies et al. | |
| 6,002,274 A | 12/1999 | Smith et al. | |
| 6,002,717 A | 12/1999 | Gaudet | |
| 6,009,424 A | 12/1999 | Lepage et al. | |
| 6,011,952 A | 1/2000 | Dankberg et al. | 455/24 |
| 6,021,110 A | 2/2000 | McGibney | |
| 6,028,658 A | 2/2000 | Hamada et al. | |

| | | | |
|---|---|---|---|
| 6,031,048 A | 2/2000 | Evans et al. | |
| 6,031,866 A | 2/2000 | Oler et al. | |
| 6,031,874 A | 2/2000 | Chennakeshu et al. | |
| 6,034,996 A | 3/2000 | Herzberg | |
| 6,035,080 A | 3/2000 | Henry et al. | |
| 6,041,299 A | 3/2000 | Schuster et al. | |
| 6,052,420 A | 4/2000 | Yeap et al. | 375/346 |
| 6,072,364 A | 6/2000 | Jeckeln et al. | |
| 6,072,615 A | 6/2000 | Mamyshev | |
| 6,078,627 A | 6/2000 | Crayford | |
| 6,084,931 A | 7/2000 | Powell, II et al. | |
| 6,091,782 A | 7/2000 | Harano | |
| 6,093,496 A | 7/2000 | Dominguez et al. | |
| 6,093,773 A | 7/2000 | Evans et al. | |
| 6,108,474 A | 8/2000 | Eggleton et al. | |
| 6,111,477 A | 8/2000 | Klymyshyn et al. | |
| 6,118,563 A | 9/2000 | Boskovic et al. | |
| 6,118,567 A | 9/2000 | Alameh et al. | |
| 6,127,480 A | 10/2000 | Dominguez et al. | |
| 6,140,416 A | 10/2000 | Evans et al. | |
| 6,140,858 A | 10/2000 | Dumont | |
| 6,140,972 A | 10/2000 | Johnston et al. | |
| 6,141,127 A | 10/2000 | Boivin et al. | |
| 6,141,387 A | 10/2000 | Zhang | |
| 6,148,428 A | 11/2000 | Welch et al. | |
| 6,151,150 A | 11/2000 | Kikuchi | |
| 6,154,301 A | 11/2000 | Harvey | |
| 6,163,638 A | 12/2000 | Eggleton et al. | |
| 6,169,764 B1 | 1/2001 | Babanezhad | 375/233 |
| 6,169,912 B1 | 1/2001 | Zuckerman | 455/570 |
| 6,181,454 B1 | 1/2001 | Nagahori et al. | |
| 6,191,719 B1 | 2/2001 | Bult et al. | |
| 6,201,916 B1 | 3/2001 | Eggleton et al. | |
| 6,208,792 B1 | 3/2001 | Hwang et al. | |
| 6,211,978 B1 | 4/2001 | Wojtunik | 359/114 |
| 6,212,654 B1 | 4/2001 | Lou et al. | |
| 6,214,914 B1 | 4/2001 | Evans et al. | |
| 6,215,812 B1 | 4/2001 | Young et al. | 375/144 |
| 6,219,633 B1 | 4/2001 | Lepage | |
| 6,222,861 B1 | 4/2001 | Kuo et al. | 372/20 |
| 6,226,112 B1 | 5/2001 | Denk et al. | |
| 6,236,963 B1 | 5/2001 | Naito et al. | |
| 6,259,836 B1 | 7/2001 | Dodds | |
| 6,259,847 B1 | 7/2001 | Lenz et al. | |
| 6,268,816 B1 | 7/2001 | Bult et al. | |
| 6,271,690 B1 | 8/2001 | Hirano et al. | 327/75 |
| 6,271,944 B1 | 8/2001 | Schemmann et al. | |
| 6,281,824 B1 | 8/2001 | Masuda | |
| 6,285,709 B1 | 9/2001 | Alelyunas et al. | |
| 6,288,668 B1 | 9/2001 | Tsukamoto et al. | |
| 6,289,055 B1 | 9/2001 | Knotz | |
| 6,289,151 B1 | 9/2001 | Kazarinov et al. | |
| 6,295,325 B1 | 9/2001 | Farrow et al. | 375/327 |
| 6,297,678 B1 | 10/2001 | Gholami | 327/198 |
| 6,298,459 B1 | 10/2001 | Tsukamoto | |
| 6,304,199 B1 | 10/2001 | Fang et al. | |
| 6,311,045 B1 | 10/2001 | Domokos | 455/78 |
| 6,313,713 B1 | 11/2001 | Ho et al. | 333/1.1 |
| 6,314,147 B1 | 11/2001 | Liang et al. | 375/346 |
| 6,317,247 B1 | 11/2001 | Yang et al. | 359/245 |
| 6,317,469 B1 | 11/2001 | Herbert | |
| 6,341,023 B1 | 1/2002 | Puc | |
| 6,356,374 B1 | 3/2002 | Farhan | 359/180 |
| 6,388,786 B1 | 5/2002 | Ono et al. | |
| 6,411,117 B1 | 6/2002 | Hatamian | 324/765 |
| 6,421,155 B1 | 7/2002 | Yano | |
| 6,445,476 B1 | 9/2002 | Kahn et al. | 359/184 |
| 6,473,131 B1 | 10/2002 | Neugebauer et al. | |
| 6,501,792 B2 | 12/2002 | Webster | |
| 6,539,204 B1 | 3/2003 | Marsh et al. | 455/63 |
| 6,560,257 B1 | 5/2003 | DeSalvo et al. | 372/38.02 |
| 6,650,189 B1 | 11/2003 | Romao | |
| 6,654,432 B1 * | 11/2003 | O'Shea et al. | 375/354 |
| 6,665,348 B1 | 12/2003 | Feher | 375/259 |
| 6,665,500 B2 | 12/2003 | Snawerdt | |
| 6,678,339 B1 * | 1/2004 | Lashkarian | 375/341 |
| 6,718,138 B1 | 4/2004 | Sugawara | 398/9 |
| 6,751,587 B2 | 6/2004 | Thyssen et al. | 704/228 |
| 6,768,780 B1 * | 7/2004 | Lakkis et al. | 375/355 |

| | | | |
|---|---|---|---|
| 6,816,101 B2 | 11/2004 | Hietala et al. | 341/155 |
| 6,819,166 B1 | 11/2004 | Choi et al. | 327/551 |
| 6,819,943 B2 | 11/2004 | Dalal | |
| 6,920,315 B1 | 7/2005 | Wilcox et al. | |
| 6,961,019 B1 | 11/2005 | McConnell et al. | 342/357.1 |
| 7,035,361 B2 | 4/2006 | Kim et al. | 375/350 |
| 7,050,388 B2 | 5/2006 | Kim et al. | 370/201 |
| 7,123,676 B2 | 10/2006 | Gebara et al. | |
| 7,149,256 B2 | 12/2006 | Vrazel et al. | |
| 7,173,551 B2 | 2/2007 | Vrazel et al. | |
| 7,212,580 B2 | 5/2007 | Hietala et al. | |
| 7,215,721 B2 | 5/2007 | Hietala et al. | |
| 7,307,569 B2 | 12/2007 | Vrazel et al. | |
| 7,340,185 B1 * | 3/2008 | Ramanujam et al. | 398/202 |
| 2001/0024542 A1 | 9/2001 | Aina et al. | 385/24 |
| 2002/0086640 A1 | 7/2002 | Belcher et al. | 455/63 |
| 2002/0196508 A1 | 12/2002 | Wei et al. | |
| 2003/0002121 A1 | 1/2003 | Miyamoto et al. | |
| 2003/0007631 A1 | 1/2003 | Bolognesi et al. | |
| 2003/0008628 A1 | 1/2003 | Lindell et al. | 455/180.1 |
| 2003/0030876 A1 | 2/2003 | Takei | 359/187 |
| 2003/0053534 A1 | 3/2003 | Sivadas et al. | 375/229 |
| 2003/0058976 A1 | 3/2003 | Ohta et al. | 375/350 |
| 2003/0063354 A1 | 4/2003 | Davidson | 359/189 |
| 2003/0067990 A1 | 4/2003 | Bryant | 375/259 |
| 2004/0053578 A1 | 3/2004 | Grabon et al. | |
| 2004/0114888 A1 | 6/2004 | Rich et al. | |
| 2004/0197103 A1 | 10/2004 | Roberts et al. | 398/159 |
| 2004/0213354 A1 | 10/2004 | Jones et al. | 375/285 |
| 2004/0218756 A1 | 11/2004 | Tang et al. | 379/417 |
| 2005/0069063 A1 | 3/2005 | Waltho et al. | 375/346 |
| 2005/0180520 A1 | 8/2005 | Kim et al. | |
| 2006/0146966 A1 | 7/2006 | Golanbari et al. | |
| 2006/0159002 A1 | 7/2006 | Kim et al. | |
| 2006/0178157 A1 | 8/2006 | Gebara et al. | |
| 2006/0291598 A1 | 12/2006 | Gebara et al. | |
| 2007/0060059 A1 | 3/2007 | Kim et al. | |
| 2007/0064923 A1 | 3/2007 | Schmukler et al. | |
| 2007/0092265 A1 | 4/2007 | Vrazel et al. | |
| 2007/0171998 A1 | 7/2007 | Hietala et al. | |
| 2007/0253495 A1 | 11/2007 | Kim | |

FOREIGN PATENT DOCUMENTS

| | | |
|---|---|---|
| EP | 0 584 865 B1 | 3/2000 |
| GB | 2 223 369 A | 4/1990 |
| GB | 2 306 066 A | 4/1997 |
| JP | 62082659 | 10/1988 |
| JP | 1990000063162 | 11/1991 |
| JP | 04187738 | 7/1992 |
| JP | 08079186 A | 3/1996 |
| WO | WO/2006/065883 A2 | 9/1994 |
| WO | WO 99/45683 | 9/1999 |
| WO | WO 01/41346 A2 | 6/2001 |
| WO | WO 02/067521 A1 | 8/2002 |
| WO | WO 02/082694 A1 | 10/2002 |
| WO | WO 02/091600 A2 | 11/2002 |
| WO | WO 03/071731 A1 | 8/2003 |
| WO | WO 03/077423 A2 | 9/2003 |
| WO | WO 03/092237 A1 | 11/2003 |
| WO | WO 2004/008782 A2 | 1/2004 |
| WO | WO 2004/045078 A2 | 5/2004 |
| WO | WO 2004/088857 A2 | 10/2004 |
| WO | WO 2005/018134 A2 | 2/2005 |
| WO | WO 2005/050896 A2 | 6/2005 |

OTHER PUBLICATIONS

Kannangara et al.; *Adaptive Duplexer for Software Radio*; Approximate Date: Nov. 11-13, 2002.

Kannangara et al.; *An Algorithm to Use in Adaptive Wideband Duplexer for Software Radio*; IEICE Transactions on Communications; Dec. 2003; vol. E86-B, No. 12; pp. 3452-3455.

Kannangara et al.; *Performance Analysis of the Cancellation Unit in an Adaptive Wideband Duplexer for Software Radio*; ATcrc Telecommunications and Networking Conference & Workshop, Melbourne, Australia, Dec. 11-12, 2003.

Williamson et al., *Performance Analysis of Adaptive Wideband Duplexer*; 2003 Australian Telecommunications, Networks and Applications Conference (ATNAC); Dec. 8-10, 2003.

Choi et al.; *A 0.18-µm CMOS 3.5-Gb/s Continuous-Time Adaptive Cable Equalizer Using Enhanced Low-Frequency Gain Control Method*; IEEE Journal of Solid-State Circuits; Mar. 2004; vol. 39, No. 3; pp. 419-425.

Paul, et al.; *3 Gbit/s Optically Preamplified Direct Detection DPSK Receiver With 116 photon/bit Sensitivity*; Electronics Letters; vol. 29, No. 7; Apr. 1, 1993; pp. 614-615.

Penninckx et al.; *Optical Differential Phase Shift Keying (DPSK) Direct Detection Considered as a Duobinary Signal*; Proc. 27th Eur. Conf. on Opt. Comm. (ECOC'01—Amsterdam); vol. 3; Sep. 30 to Oct. 4, 2001; pp. 456-457.

Rohde et al.; *Robustness of DPSK Direct Detection Transmission Format in Standard Fibre WDM Systems*; Electronics Letters; vol. 36, No. 17; Aug. 17, 2000; pp. 1483-1484.

Shirasaki et al.; *Fibre Transmission Properties of Optical Pulses Produced Through Direct Phase Modulation of DFB Laser Diode*; Electronics Letters; vol. 24, No. 8; Apr. 14, 1988; pp. 486-488.

Weger et al.; *Gilbert Multiplier as an Active Mixer with Conversion Gain Bandwidth of up to 17GHz*; Electronics Letters; 28th Mar. 1991; vol. 27, No. 7; pp. 570-571.

André et al.; *InP DHBT Technology and Design Methodology for High-Bit-Rate Optical Communications Circuits*; IEEE Journal of Solid-State Circuits; vol. 33, No. 9, Sep. 1998; pp. 1328-1335.

Borjak et al.; *High-Speed Generalized Distributed-Amplifier-Based Transversal-Filter Topology for Optical Communication Systems*; IEEE Transactions on Microwave Theory and Techniques; vol. 45, No. 8; Aug. 1997; pp. 1453-1457.

Buchali et al.; *Fast Eye Monitor for 10 Gbit/s and its Application for Optical PMD Compensation*; Optical Society of America; (2000); pp. TuP5-1-TuP1-3.

Cartledge et al.; *Performance of Smart Lightwave Receivers With Linear Equalization*; Journal of Lightwave Technology; vol. 10, No. 8; Aug. 1992; pp. 1105-1109.

Chi et al.; *Transmission Performance of All-Optically Labelled Packets Using ASK/DPSK Orthogonal Modulation*; The 15th Annual Meeting of the IEEE Lasers and Electro-Optics Society, 2002; LEOS 2002; Nov. 10-14, 2002; vol. 1:51-52. The whole document.

Chiang et al.; *Implementation of STARNET: A WDM Computer Communications Network*; IEEE Journal on Selected Areas in Communications; Jun. 1996; vol. 14, No. 5; pp. 824-839.

Cimini et al.; *Can Multilevel Signaling Improve the Spectral Efficiency of ASK Optical FDM Systems?*; IEEE Transactions on Communications; vol. 41, No. 7; Jul. 1993; pp. 1084-1090.

Downie et al.; *Performance Monitoring of Optical Networks with Synchronous and Asynchronous Sampling*; Corning Incorporated, Science and Technology; SP-AR-02-1; p. WDD50-1; Abstract.

Enning et al.; *Design and Test of Novel Integrate and Dump Filter (I&D) for Optical Gbit/s System Applications*; Electronics Letters; (Nov. 21, 1991); vol. 27, No. 24; pp. 2286-2288.

Fürst et al.; *Performance Limits of Nonlinear RZ and NRZ Coded Transmission at 10 and 40 Gb/s on Different Fibers*; pp. 302-304.

Garrett, Ian; *Pulse-Position Modulation for Transmission Over Optical Fibers with Direct or Heterodyne Detection*; IEEE Transactions on Communications; vol. COM-31; No. 4; Apr. 1983; pp. 518-527.

Godin et al.; *A InP DHBT Technology for High Bit-rate Optical Communications Circuits*; IEEE; (1997); pp. 219-222.

Haskins et al.; *FET Diode Linearizer Optimization for Amplifier Predistortion in Digital Radios*; IEEE Microwave and Guided Wave Letters; vol. 10, No. 1; Jan. 2000; pp. 21-23.

Hranilovic et al.; *A Multilevel Modulation Scheme for High-Speed Wireless Infrared Communications*; IEEE; (1999); pp. VI-338-VI-341.

Idler et al.; *40 Gbit/s Quaternary Dispersion Supported Transmission Field Trial Over 86 km Standard Singlemode Fibre*; 24th European Conference on Optical Communication; Sep. 1998; pp. 145-147.

Jutzi, Wilhelm; *Microwave Bandwidth Active Transversal Filter Concept with MESFETs*; IEEE Transactions on Microwave Theory and Technique, vol. MTT-19, No. 9; Sep. 1971; pp. 760-767.

Kaess et al.; *New Encoding Scheme for High-Speed Flash ADC's*; IEEE International Symposium on Circuits and Systems; Jun. 9-12, 1997; Hong Kong; pp. 5-8.

Kaiser et al.; *Reduced Complexity Optical Duobinary 10-Gb/s Transmitter Setup Resulting in an Increased Transmission Distance*; IEEE Photonics Technology Letters; Aug. 2001; vol. 13; No. 8; pp. 884-886.

Lee et al.; *Effects of Decision Ambiguity Level on Optical Receiver Sensitivity*; IEEE Photonics Technology Letters; vol. 7, No. 19; Oct. 1995; pp. 1204-1206.

Marcuse, Dietrich; *Calculation of Bit-Error Probability for a Lightwave System with Optical Amplifiers and Post-Detection Gaussian Noise*; Journal of Lightwave Technology; vol. 9, No. 4; Apr. 1991; pp. 505-513.

Megherbi et al.; *A GaAs-HBT A/D Gray-Code Converter*; IEEE; (1997); pp. 209-212.

Nazarathy et al.; *Progress in Externally Modulated AM CATV Transmission Systems*; Journal of Lightwave Technology; vol. 11, No. 1; Jan. 1993; pp. 82-105.

Oehler et al.; *A 3.6 Gigasample/s 5 bit Analog to Digital Converter Using 0.3 µm AlGaAs-HEMT Technology*; IEEE; (1993); pp. 163-164.

Ohm et al.; *Quaternary Optical ASK-DPSK and Receivers with Direct Detection*; IEEE Photonics Technology Letters; Jan. 2003; vol. 15, No. 1; pp. 159-161.

Ohtsuki et al.; *BER Performance of Turbo-Coded PPM CDMA Systems on Optical Fiber*; Journal of Lightwave Technology; vol. 18; No. 12; Dec. 2000; pp. 1776-1784.

Ota et al.; *High-Speed, Burst-Mode, Packet-Capable Optical Receiver and Instantaneous Clock Recovery for Optical Bus Operation*; Journal of Lightwave Technology; vol. 12, No. 2; Feb. 1994; pp. 325-331.

Poulton et al.; *An 8-GSa/s 8-bit ADC System*; Symposium on VLSI Circuits Digest of Technical Papers; (1997); pp. 23-24.

Poulton et al.; *A 6-b, 4 GSa/s GaAs HBT ADC*; IEEE Journal of Solid-State Circuits; vol. 30, No. 10.; Oct. 1995; pp. 1109-1118.

Poulton et al.; *A 6-bit, 4 GSa/s ADC Fabricated in a GaAs HBT Process*; IEEE; (1994); pp. 240-243.

Prasetyo et al.; *Application for Amplitude Gain Estimation Techniques for Multilevel Modulation in OFDM Systems*; IEEE; (1998); pp. 821-824.

Runge et al.; *High-Speed Circuits for Lightwave Communications*; 1999; World Scientific, pp. 181-184.

Shtaif et al.; *Limits on the Spectral Efficiency of Intensity Modulated Direct Detection Systems with Optical Amplifiers*; AT&T Labs Research; pp. MM1-1-MM1-3.

Su et al.; *Inherent Transmission Capacity Penalty of Burst-Mode Receiver for Optical Multiaccess Networks*; IEEE Photonics Technology Letters; vol. 6, No. 5; May 1994; pp. 664-667.

Vodhanel et al.; *Performance of Directly Modulated DFB Lasers in 10-Gb/s ASK, FSK, and DPSK Lightwave Systems*; Journal of Lightwave Technology; Sep. 1990; vol. 8, No. 9; pp. 1379-1386.

Vorenkamp et al.; *A 1Gs/s, 10b Digital-to-Analog Converter*; ISSCC94/Session 3/Analog Techniques/Paper WP 3.3; pp. 52-53.

Wakimoto et al.; *Si Bipolar 2-GHz 6-bit Flash A/D Conversion LSI*; IEEE Journal of Solid-State Circuits; Dec. 1988; vol. 23, No. 6; pp. 1345-1350.

Walkin et al.; *A 10 Gb/s 4-ary ASK Lightwave System*; ECOC; 1997; pp. 255-258.

Walklin et al.; *Multilevel Signaling for Extending the Dispersion-Limited Transmission Distance in High-Speed, Fiber Optic Communication Systems*; IEEE; 1996; pp. 233-236.

Walklin et al.; *Multilevel Signaling for Increasing the Reach of 10 Gb/s Lightwave Systems*; IEEE Journal of Lightwave Technology; vol. 17; No. 11; Nov. 1999; pp. 2235-2248.

Wang et al.; *Multi-Gb/s Silicon Bipolar Clock Recovery IC*; IEEE Journal on Selected Areas in Communications; vol. 9, No. 5; Jun. 1991; pp. 656-663.

Webb, William T.; *Spectrum Efficiency of Multilevel Modulation Schemes in Mobile Radio Communications*; IEEE Transactions on Communications; vol. 43, No. 8; Aug. 1995; pp. 2344-2349.

Wedding et al.; *Multi-Level Dispersion Supported Transmission at 20 Gbit/s Over 46 km Installed Standard Singlemode Fibre*; 22nd European Conference on Optical Communication; 1996; pp. 91-94.

Wedding et al.; *Fast Adaptive Control for Electronic Equalization of PMD*; Optical Society of America; (2000); pp. TuP4-1-TuP4-3.

Westphal et al.; *Lightwave Communications*; 1994; Thursday Afternoon/CLEO '94; pp. 337-338.

Wilson et al.; *Predistortion of Electroabsorption Modulators for Analog CATV Systems at 1.55 μm*; Journal of Lightwave Technology; vol. 15, No. 9; Sep. 1997; pp. 1654-1662.

Author: Unknown; *Digital Carrier Modulation Schemes*; Title: Unknown; Date: Unknown; pp. 380-442.

International Search Report for PCT Application No. PCT/US03/35887 dated Jun. 4, 2004.

\* cited by examiner

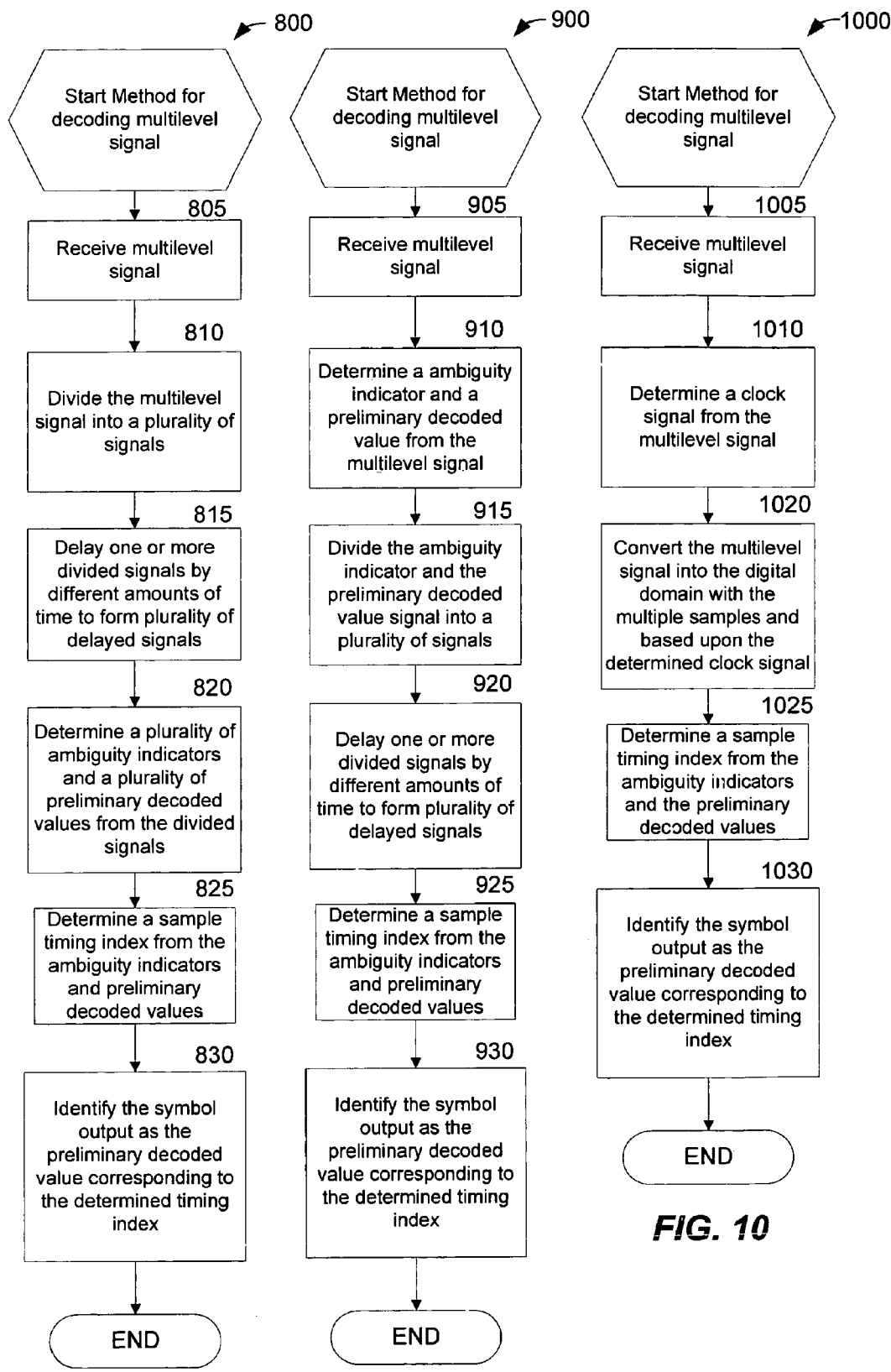

US 7,934,144 B2

HIGH-SPEED ANALOG-TO-DIGITAL CONVERSION WITH IMPROVED ROBUSTNESS TO TIMING UNCERTAINTY

STATEMENT REGARDING RELATED APPLICATIONS

This application claims priority to provisional patent application entitled, "HIGH-SPEED ANALOG-TO-DIGITAL CONVERSION WITH IMPROVED ROBUSTNESS TO TIMING UNCERTAINTY," filed on Nov. 12, 2002 and assigned U.S. application Ser. No. 60/425,985, the entire contents of which are hereby incorporated by reference.

TECHNICAL FIELD

This invention relates to the receiver of a communications system, and more particularly, to a receiver for decoding or detecting discrete signal levels from an analog or digital waveform containing data.

BACKGROUND OF THE INVENTION

Digital communication involves the generation and reception of analog waveforms to convey digital data as illustrated in FIG. 1. The transmitter 101 takes as input a sequence of data and converts it into an analog waveform. The waveform is transmitted over a medium or channel 102 to a receiver 103, which decodes the original data from the received waveform.

The transmitter 101 generating the waveform sets the signal amplitude, phase, and/or frequency to one of N discrete values to represent digital information where N is the specified number of signal levels. This level or symbol is transmitted for a predetermined time period called the symbol period and denoted as $T_0$. A symbol is transmitted once every symbol period. In particular, a clock signal with period $T_0$ is used to determine when to send a new symbol. In this fashion, the transmitter conveys digital data as a sequence of symbols to a receiver 103. An exemplary binary on-off keyed waveform 200 is illustrated in FIG. 2 to illustrate some of the attributes of an exemplary communication signal that can comprise a multilevel signal, and in this case, a binary form of a multilevel signal.

In FIG. 2, one of two discrete amplitude values (201, 202) is transmitted every symbol period $T_0$ to convey a bit of information (i.e. a binary '0' or '1'). The demarcations 203 illustrate the division from one symbol to another. When the symbol level changes, the demarcation is termed a signal "edge" or "transition".

The task of a receiver 103 is to decode the digital information (i.e. detect which of the N levels was transmitted) from the communicated analog waveform 200. During transmission, the communicated signal can be degraded. In particular, it can be distorted by the transmission channel resulting in what is known as intersymbol interference (ISI) and corrupted by noise or interference from external sources. The distortion and noise can lead to decoding errors. It is a goal of receiver design to minimize the frequency of these errors.

Consistent with the transmitter 101, the receiver 103 decodes one symbol every symbol period. Similar to the transmitter 101, a clock signal is used to mark the precise time at which to decode a symbol. This clock signal may be obtained from the same clock (not shown) used to drive the transmitter, but it is more often the case that the clock signal is reconstructed from the communicated waveform 200 in a process known as clock-recovery (CR) as depicted in FIG. 1.

Ideally, the recovered clock signal would be an exact replica of the clock used at the transmitter 101. In particular, it would be a periodic signal with period $T_0$. Furthermore, the timing of each sample would ideally convey a maximum amount of information about the corresponding originally transmitted symbol. Unfortunately, in many instances, this is not the case. In particular, the recovered clock signal can exhibit jitter, which is the presence of erratic perturbations of the sample timing which can result in suboptimal decoding.

When jitter is present in the clock signal, instead of decoding a symbol exactly once every symbol period, a symbol is usually decoded only approximately once every symbol period. In other words, sometimes the samples are drawn faster than once every $T_0$ (i.e. drawn too early), and sometimes the samples are drawn slower than once every $T_0$ (i.e. drawn too late), but on the average, they are usually drawn every $T_0$. These timing deviations result in decoding samples closer to the signal edges thereby increasing the chance of decoding errors.

In addition to problems introduced by jitter, decoding at the "right time" is problematic because there might not exist a single periodic time instance, which captures all the available information about the transmitted symbol in the waveform. In particular, even in the optimistic case of having a perfect clock signal at the receiver 103, the clock signal may not provide the best sampling times. These less ideal sampling times can arise due to distortion of the transmitted signal.

For example, in optical communications, it is well known that the chirp distortion on an optical signal can skew the optimal sampling point in a data-dependent fashion. Specifically, the propagation delay for a large amplitude pulse is different than that for a small amplitude pulse. This delay difference can result in (i) an eye-diagram that appears "tilted" and (ii) different optimal sampling points for the different data values.

The problem associated with such a delay difference is illustrated in FIG. 3. FIG. 3 illustrates an eye-diagram 300 of a received optical signal distorted by chirp that can be produced by a direct-modulation laser. Chirp can delay the large amplitude portions 301 of the signal by a larger amount than the small amplitude portions 302 of the signal.

A received signal is usually sampled where the signal is maximally flat and is at one of the amplitude extremes such as at a first time 303 for the large amplitude signal portions and at a second time 304 for the small amplitude signal portions since it is at these points where one has the least likelihood of having a decoding error. Consequently, the optimum sampling time depends on the underlying symbol value and must therefore change on a symbol-by-symbol basis. However, conventional systems use a data-independent sampling point, such as a third time 305 which happens in this case to fall between the first time 303 and the second time 304. The use of such a data-independent sampling time is less than optimal as it does not sample at the amplitude extremes for either the large or small amplitude portions.

As another example, in high-speed communications, the transmission channel often distorts the waveform resulting in what is called dispersion where the signal data characteristic (e.g. amplitude) for one symbol bleeds over into adjacent symbols. It is common practice to counteract this distortion with equalization. Equalization is a "distortion" that is the inverse of the channel response. Unfortunately, it is usually impractical to exactly equalize away all of the channel distortion. The residual distortion can manifest itself as intersymbol interference (ISI) where the received amplitude of one symbol is affected by the transmitted amplitude of surrounding symbols rather than just the current symbol, as is the ideal case.

This ISI can cause two significant problems. Firstly, the ISI can shift the optimal sampling time from the center of the symbol period and have the amount of the shift being dependent on the preceding and succeeding data symbol values. This shift is data-dependent and thus changes on a symbol-by-symbol basis.

Secondly, ISI can temporally shift the symbol transition or edges locations. These shifts can lead to data-dependent jitter (DDJ) in the clock recovery (CR) unit 104 thereby increasing the jitter in the reconstructed clock signal used to drive the decoding unit 105 in the receiver 103.

The problems described above can limit the performance of signal decoding. In particular, the loss of information associated with scalar sampling (i.e. decoding using only a single sample per symbol period) in the presence of timing uncertainty (such as jitter or data-dependent optimal sample times) results in too many decoding errors. Some conventional methods address a few aspects of the jitter problems associated with scalar sampling but they do not solve these problems completely. Many conventional methods and systems attempt to reconstruct the transmitter clock signal at the receiver 103. In particular, those clock recovery (CR) methods are designed to minimize sampling jitter and produce a sampling clock signal with as constant a symbol period as possible. Towards this end, conventional methods and systems attempt to determine an optimal sampling phase by temporally shifting the clock signal so that the receiver 103 periodically samples in an appropriate location.

Conventional methods and systems for temporally shifting the clock signal are usually distinguishable from one another in the manner in which they arrive at such a phase offset. These conventional methods and systems usually attempt to find a single constant or slowly-varying phase value by keeping the variability of the time between sampling points to a minimum. In particular, conventional methods and systems assume the existence of an underlying periodic optimal sample time and they often ignore the fact that the optimal sample time may vary in a data-dependent fashion (and in particular with each symbol) as described above.

While some conventional methods and systems for decoding received signals recognize the need for symbol-by-symbol adjustment of the sampling point, these conventional methods and systems oversample the signal such as regularly sampling the received signal several times within a symbol period and outputting one of the decoded oversampled values as the decoded symbol. These methods and systems can differ by how they determine which of the plurality of decoded oversampled values to output. All of these methods and systems, however, rely on the signal edges to select the oversampled value. For example, some methods and systems output the decoded oversampled value as soon as a predetermined number of decoded values produce an identical value. Such an approach is effectively taking the decoded sample as soon as a valid pulse is detected (as indicated by the consecutive decoded values). This approach has a drawback in that the predetermined number of consecutive decoded values may not be achieved in a symbol period due to signal distortion and noise. In this case, the indicator for adjusting the sample location is absent and therefore cannot guide the decoding process, and it effectively operates in a blind mode of operation. This drawback is the result of an inherent assumption of the method that amplitude distortions are relatively insignificant and sample timing uncertainty is the only factor affecting decoding performance. However, in many communications systems (especially in high-speed systems), it is both sample timing uncertainty and amplitude distortion that causes decoding errors.

Other conventional methods and systems use a sample time that adjusts on a symbol-by-symbol basis. In particular, using the oversampled received signal, the preceding and succeeding edges for each symbol can be detected and the sample time can be taken as the midpoint between the two edges. Thus, this conventional method takes the temporal midpoint of the symbol as the sample time. While very intuitive, this conventional method assumes the received pulses are symmetric in time. In general, this is not the case as many communications channels introduce distortions (such as phase distortions), which can skew the received pulse and result in a sample location that is not in the temporal center of the symbol.

Most conventional methods and systems for decoding received signals propose techniques and hardware that are of considerably complexity especially if the techniques and hardware are considered for high-speed communications systems. Because of their complexity, these conventional techniques and hardware push the speed limitations of integrated circuit (IC) technology. At the time of this writing, high speed communications are moving at speeds on the order of tens of gigabits per second (Gbps).

The oversampling in conventional methods and systems is impractical at these high data speeds because the technology does not exist to build the required high-resolution analog-to-digital converters (ADCs) that sample at these rates let alone the multiples of these rates required for oversampling. Furthermore, the conventional methods and systems often require microprocessors or complex state machines that can process the data at these high data rates.

Microprocessors operating on the order of 100 GHz or more do not exist as of this writing, and it is of extreme difficulty to build the logic that operates at tens of Gigahertz. Additionally, even if the speeds involved were not prohibitive because of advances in IC technology over time, a method requiring less complex and sophisticated circuitry could cost less to implement, and consequently, provide an economic advantage.

Thus, there is a need in the art for a simple method and system for achieving a robust decoding process that can resolve timing uncertainties due to phenomena such as signal distortion, noise, and timing jitter. There is also a need in art for a receiver sampling method and system that adjusts to sample timing on a symbol-by-symbol basis to account for a data-dependent optimal sampling point. Further, there is a need in the art for a decoding method and system that adjusts for optimal sample timing variations in the presence of considerable amplitude distortions and noise. Additionally, there is a need in the art for a method and system that adjusts for optimal sample timing variations where the received pulses are not necessary symmetric. There is also a need in the art a low-complexity solution that can be implemented in an economically practical fashion.

SUMMARY OF THE INVENTION

The present invention includes a method and system that can resolve sample timing uncertainties that can occur during signal decoding by using the principle of generalized maximum likelihood estimation. Timing uncertainties in decoding received signals can be caused by clock jitter in the receiver, signal noise, or signal distortion, or any combination thereof.

While timing uncertainty can vary on a symbol-by-symbol basis, such timing uncertainty can be resolved with the present invention.

By applying the principle of generalized maximum likelihood estimation, the problem of timing uncertainty can be resolved by taking multiple samples of the received signal within a symbol period and determining which sample best corresponds to an optimal sample timing using simple analog processing and digital logic. The sample which best corresponds to an optimal sample timing can be determined from a timing index. The timing index can correspond to a nuisance parameter of an equation that embodies the principle generalized maximum likelihood estimation. The timing index can be calculated from ambiguity indicators that are based on the samples of the received signal.

The ambiguity indicators can generally correspond to a confidence level as to whether a preliminary decoded value is likely to be equal to the original transmitted value. Unlike the prior art which ignores timing uncertainty and thus the nuisance parameter, the present invention can include the nuisance parameter as factor in the decoding process.

According to one exemplary aspect, the present invention can include a plurality of soft-decoders. Each soft-decoder can sample the received signal at a different time within a symbol period and output two values. Each first value can comprise a preliminary decoded value while each second value can comprise an ambiguity indicator. Coupled to each soft-decoder can be a logic device that can determine a decoded value based on the one or more preliminary decoded values and ambiguity indicators.

According to another exemplary aspect, the present invention can include an analog-to-digital converter for sampling the received signal faster than once every single symbol period of the original signal. The converter can be coupled to a processor that can group a subset of sampled values derived from the single symbol period. The processor can also examine the subset of values and it can determine a value closest to an optimum sampling time based on the principle of generalized maximum likelihood estimation. The processor can then decode a value closest to the optimum sampling time and output that value as the decoded symbol.

BRIEF DESCRIPTION OF THE DRAWINGS

FIG. 8 is a logic flow diagram illustrating an exemplary method for decoding a received signal according to the first exemplary embodiment of the present invention illustrated in FIG. 4.

FIG. 9 is a logic flow diagram illustrating an exemplary method for decoding a received signal according to the second exemplary embodiment of the present invention illustrated in FIG. 6.

FIG. 10 is a logic flow diagram illustrating an exemplary method for decoding a received signal according to the third exemplary embodiment of the present invention illustrated in FIG. 7.

DETAILED DESCRIPTION OF EXEMPLARY EMBODIMENTS OF THE INVENTION

Figure 1:
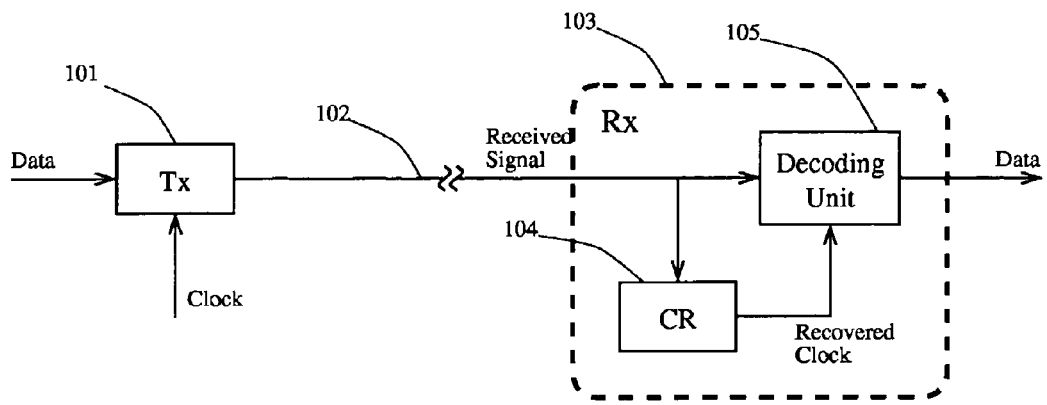
FIG. 1 is a block diagram of a conventional communications system.

A method and system can resolve sample timing uncertainties that occur during received signal decoding by using the principle of generalized maximum likelihood estimation. By using generalized maximum likelihood estimation, timing uncertainty can be resolved by taking multiple samples of the received signal within a symbol period and determining which sample best corresponds to an optimal sample timing. The sample which best corresponds to an optimal sample timing can be determined from a timing index. The timing index can be calculated from ambiguity indicators that are based on the samples of the received signal.

The ambiguity indicators can correspond to a confidence level as to whether a preliminary decoded value is likely to be equal to the originally transmitted value. The ambiguity indicators can also correspond to a nuisance parameter of an equation based on the principle of generalized maximum likelihood estimation.

While the present invention is described in connection with a two-level (binary) signal where the information is encoded in the signal amplitude, the present invention is applicable to digital or analog signals comprising two or more levels where the information is encoded in one or more of the signal amplitude, phase, and frequency.

A multilevel signal can allow for more than one bit to be transmitted per clock cycle, thereby improving the efficiency of the transmitted signal. For multilevel transmissions, some characteristic (i.e., signal property) of a transmitted pulse (such as amplitude, phase, frequency, etc.) can be modulated over $2^n$ levels in order to encode n bits into the single pulse, thereby improving the efficiency of the transmitted pulse. Multilevel modulation can increase aggregate channel throughput by combining n on-off keying (OOK) data streams (each with bit rate, B, in bits/s) into one $2^n$-level signal (with a symbol rate, B, in symbols/s) for an aggregate throughput (in bits/s) that is n times greater than B.

For example, an aggregate data rate of a sixteen-level signal can be four times greater than a corresponding OOK signal with a bit rate equal to the multilevel symbol rate. As the simplest case, OOK can be regarded as a two level multilevel signal where the symbol rate and bit rate are equal.

As discussed above, the present invention can use multiple samples from the same symbol period of a received signal to decode each symbol communicated in the waveform. The use of more than one sample exploits the temporal variations and can provide robustness in calculating timing uncertainties caused by jitter and data-dependent skew.

Conventional scalar sampling is based on the principle of maximum likelihood (ML) decoding. In particular, a received waveform x(t) is sampled every $T_0$ seconds where $T_0$ is the symbol period of communications link. The sample $x(kT_0)$ (for integers k) is then decoded by comparison against a threshold for a binary system (or a set of thresholds for a multilevel communications system). Specifically, the ML decoding rule for the $k^{th}$ symbol is given as $$d^{(k)} = \underset{s^{(k)}}{\operatorname{argmax}} \{p(x(kT_0) \mid s^{(k)})\} \quad (1)$$

where $s^{(k)}$ represents a candidate transmitted symbol value, $d^{(k)}$ represents the $k^{th}$ decoded symbol, and $p(x(kT_0)|s^{(k)})$ represents the probability of receiving value $x(kT_0)$ conditioned on the event that $s^{(k)}$ was the $k^{th}$ symbol transmitted. The entity $p(x(kT_0)|s^{(k)})$ is widely termed a "likelihood", as in "the likelihood that $x(kT_0)$ is observed given that $s^{(k)}$ is transmitted". As its name implies, the ML approach chooses the value of $s^{(k)}$ which maximizes the likelihood of the received value. It is known to those skilled in the art that ML decoding is optimal in the sense that it minimizes the number of decoding errors for equally like transmitted symbols.

The current invention is based on the principle of generalized maximum likelihood (GML) decoding. The optimality of the ML rule in Eq. (1) is conditioned on the fact that the lone sample $x(kT_0)$ captures all the information regarding the datum $s^{(k)}$ from the waveform $x(t)$, i.e. the decoding cannot be improved by using another or additional samples. But, as described earlier, this is not the case in general. For one, samples are not drawn exactly every $T_0$ seconds (i.e. at $t=kT_0$) due to timing jitter. In particular, jitter perturbs the sample timing by an unknown value. Letting $\epsilon^{(k)}$ denote the unknown timing perturbation for the $k^{th}$ symbol, the received waveform is sampled at time $t=kT_0+\epsilon^{(k)}$ rather than $t=kT_0$.

In addition to the timing uncertainty caused by jitter, it may not be optimal to sample at the same point within each symbol period due to the effects of channel distortion such as ISI and chirp. These distortions change the optimal sampling time from $t=kT_0$ to $t=kT_0+\sigma^{(k)}$ where $\sigma^{(k)}$ is a data-dependent quantity and varies on a symbol-by-symbol basis.

Considering these effects together, we note that while the optimal sampling time is $t=kT_0+\sigma^{(k)}$ for sample k, the decoding unit is only provided with the jitter-corrupted clock timings $t'=kT_0+\epsilon^{(k)}$. Thus, it is desired to sample at time $t=kT_0+\sigma^{(k)}=t'-\epsilon^{(k)}+\sigma^{(k)}$. For notational simplicity, this can be rewritten as $t=t'+\tau^{(k)}$ where $\tau^{(k)}$ captures all the symbol-by-symbol timing uncertainty (caused by both jitter and signal distortion) for the $k^{th}$ symbol. If we ignore the presence of $\tau^{(k)}$, as is conventionally done, we would not be fully utilizing the information in the signal. However, the present invention follows the GML concept in estimating both the nuisance parameter $\tau^{(k)}$ and the parameter of interest $s^{(k)}$, but it reports only the estimate of $s^{(k)}$ (i.e. the decoded-symbol) as $\tau^{(k)}$ is only used to improve the estimate $s^{(k)}$ by accounting for timing uncertainty. In particular, the present invention attempts to solve the problem defined by Equation (2):

$$d^{(k)} = \underset{s^{(k)}}{\operatorname{argmax}} \left\{ \underset{\tau^{(k)}}{\max} p(x(t'+\tau^{(k)}) \mid s^{(k)}, \tau^{(k)}) \right\}. \quad (2)$$

While firmly principled, solving Eq. (2) is difficult in high-speed analog electronics. In particular, not only would it involve the analysis of the signal at a variety of time samples, but it would also involve the selection of the maximum likelihood timing adjustment $\tau^{(k)}$ and this operation would have to be performed at the symbol communication speed. To bypass these implementation difficulties, several practical and exemplary embodiments of the invention are described which approximate the GML rule in Eq. (2) with a simple combination of analog and digital hardware. To simplify the notation slightly, the superscript (k) on d, s, and $\tau$ will be omitted as it will be understood that we are always decoding the current symbol.

For ease of presentation, these embodiments will be presented for the binary signaling case. However, those skilled in the art will recognize that the extension to signals with more than two levels is straightforward. Such extensions to signals with more than two levels are understood to be included as exemplary embodiments of the present invention. Furthermore, the exemplary embodiments are described using three versions of the signal differing only by their delays. Those skilled in the art will recognize that extending the described methodology to include more than three delays is not beyond the scope of the present invention and can offer additional robustness to timing uncertainties. Such extensions are inherently included as part of exemplary embodiments described below.

First Exemplary Embodiment

Figure 4:
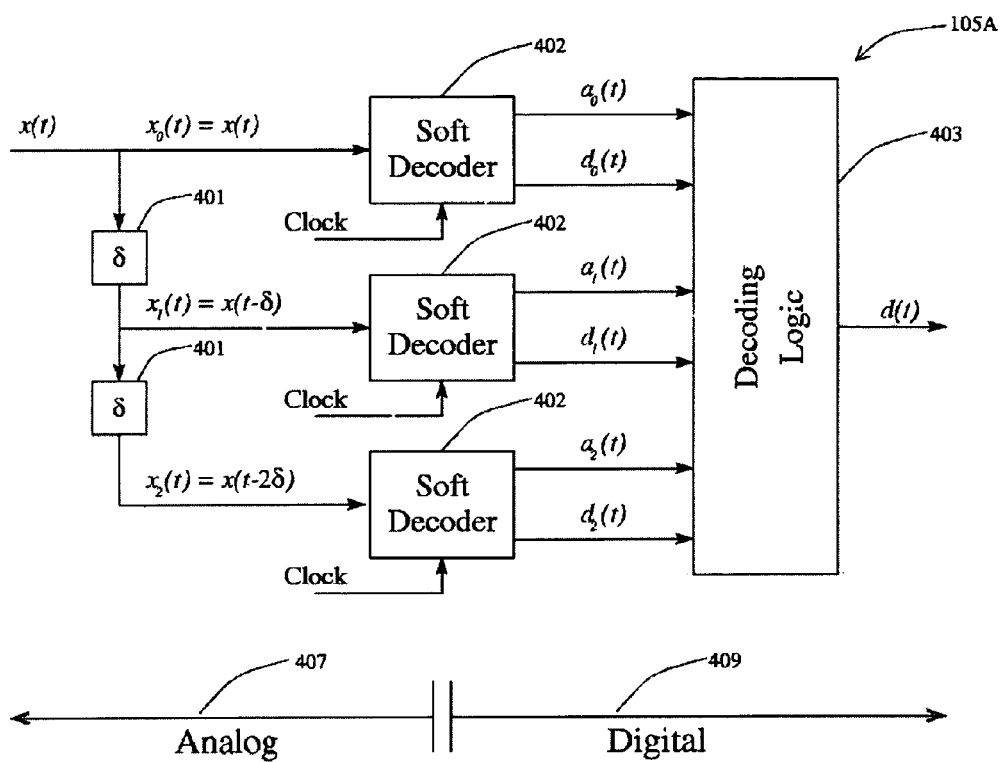
FIG. 4 is functional block diagram of a decoding unit according to one exemplary embodiment of the present invention.
Figure 5:
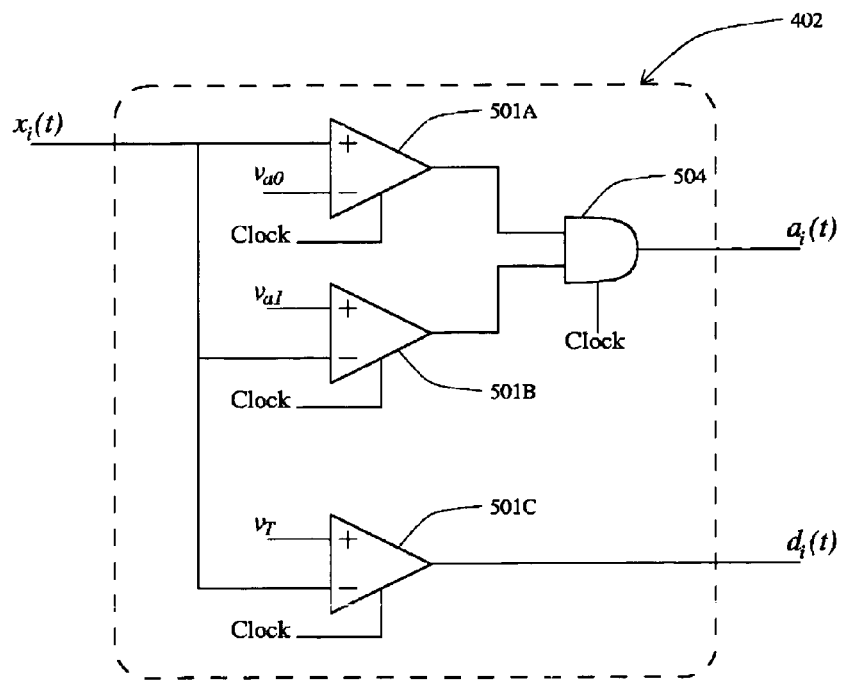
FIG. 5 is a block diagram of a soft-decoder according to one exemplary embodiment of the present invention.

Referring again now to the drawings, in which like numerals represent like elements throughout the several Figures, aspects of the present invention and the illustrative operating environment will be described. FIGS. 4 and 5 illustrate one exemplary decoding unit 105A of the current invention. In these figures, analog processing modules such as modules that usually allow a continuum of signal levels and do not operate according to a clock signal are described. Further, digital processing modules such as modules that may force the signal level to the discrete digital levels and operate on a clocked basis are also described. Additionally, modules incorporating aspects of both analog and digital functionality are also described.

At the bottom of FIG. 4, two arrows 407, 409 show how the signals and modules are partitioned into the analog and digital domains. Signals on the left-side of the figure over the "Analog" left arrow 407 are analog in nature. While these signals originated from a digital source, they may have been distorted by the transmission channel and noise. The modules in this "Analog" section cannot assume that the input signal only has one of the predetermined digital levels as doing so may further distort the signal. Signals on the right-side of the figure over the "Digital" right arrow 409 are digital in nature. This occurs after the soft-decoder 402 and the signals at this point are all well-formed signals. Thus, modules in this domain may take advantage of the digital nature of the signal for simpler implementation of the defined functionality.

FIG. 4 illustrates a functional block diagram giving an overview of one exemplary embodiment of a decoding unit 105A. In FIG. 4, the received signal x(t) is split off and fed through several analog delay stages or elements 401 of delay $\delta$ to produce three delayed versions of the signal: $x_0(t)=x(t)$, $x_1(t)=x(t-\delta)$, and $x_2(t)=x(t-2\delta)$. The delay $\delta$ is assumed to be small relative to the symbol period $T_0$, but in some circumstances, may be as large as $T_0/2$. Note that the input clock and x(t) are assumed to be synchronized such that $t-\delta$ nominally (i.e. without timing uncertainty) corresponds to the conventional sampling point $kT_0$. For instance, $x(t-\delta)$ can be considered the middle of the symbol pulse. If the input clock and x(t) are not appropriately synchronized, then this timing bias can produce additional timing uncertainty for which the present invention can also correct.

However, correcting for this timing error bias may detract from the present invention's ability to correct other sources of timing uncertainty. Because the timing error bias can be resolved with conventional methods, it can advantageous in some exemplary embodiments to use conventional methods in order to allow the present invention to have as much corrective capacity as possible to adjust for the more complex timing uncertainties that vary on a symbol-by-symbol basis.

Each of the signals $x_i(t)$ is fed into identical soft-decoders 402 which provide a preliminary decoding of the signal. In contrast to soft-decoders 402, a conventional hard-decoder is a device which makes a "hard" decision on the symbol value, e.g. a '0' or '1' in binary settings. A soft-decoder 402, on the other hand, makes a tentative decision. Instead of only declaring the decoded value, it also conveys a level of confidence that the decoded value is correct. In binary communications, for example, a soft-decoder 402 may output one or more of the following:

- '0' to signify strong confidence in its choice that the symbol is a '0',
- '0?' to signify that the symbol is most likely to be a '0' but there is a nontrivial probability that it may be a '1',
- '1?' to signify that the symbol is most likely to be a '1' but there is a nontrivial probability that it may be a '0', and
- '1' to signify strong confidence in its choice that the symbol is a '1'.

The outputs of the soft-decoders 402 mentioned above are not limited to the pair of binary symbols (the integer with a question mark or space) discussed above. The outputs mentioned above represent four different characterizations of confidence levels. Those skilled in the art will appreciate that fewer or more characterizations using different symbols for the characterizations are not beyond the scope and spirit of the present invention.

The soft-decoder 402 used in the present invention operates in this manner. Specifically, given analog input $x_i(t)$, the soft-decoder outputs two signals $a_i(t)$ and $d_i(t)$. The signal $d_i(t)$ is a hard binary characterization of $x_i(t)$, i.e. a '0' or '1'. For example, $d_i(t)$ can be the ML decoded value of $x_i(t)$, or more generally, $d_i(t)$ can be $x_i(t)$ compared to some decision threshold. The signal $a_i(t)$ is a binary ambiguity indicator signifying whether or not the soft-decoder is confident in its decision $d_i(t)$, i.e. $a_i(t)$ conveys whether or not $d_i(t)$ is highly probable to correctly represent the current symbol. In the above described output of an exemplary soft-decoder, the ambiguity indicator can corresponds on whether or not there should be a '?' associated with the hard decoded value $d_i(t)$. It is apparent to those skilled in the art that just as the decision $d_i(t)$ can take on more than two levels for multilevel contexts, the ambiguity indicator $a_i(t)$ can take on more than two levels (regardless of whether the signal comprises two or more levels) to allow more degrees of confidence in the decision $d_i(t)$ to be conveyed.

An exemplary soft-decoder 402 is illustrated in FIG. 5. In this figure, the analog input $x_i(t)$ is fed to three comparators 501A-501C with associated thresholds $V_{a0}$, $V_T$, and $V_{a1}$ which satisfy $V_{a0} < V_T < V_{a1}$. The bottom-most comparator 501C in the figure compares $x_i(t)$ to the decision threshold $V_T$ which yields a hard-decoded output $d_i(t)$ for $x_i(t)$. When the threshold $V_T$ is appropriately set, this hard-decoded output $d_i(t)$ corresponds to ML decoding on $x_i(t)$.

The first pair of comparators 501A and 501B in FIG. 5 threshold $x_i(t)$ against reference levels $V_{a0}$ and $V_{a1}$. The outputs of the first two comparators 501A and 501B are fed into a logical binary element 504 such as logical AND gate. The voltages $V_{a0}$ and $V_{a1}$ define what is referred to as the ambiguity range. If a received value falls within this ambiguity range, then the value is said to be ambiguous because the sample value is close to the decision threshold $V_T$. When $x_i(t)$ falls within the ambiguity range $V_{a0} < x_i(t) < V_{a1}$, both comparator outputs are true and the ambiguity indicator $a_i(t)$ is thus set to true. If $x_i(t)$ is not in the ambiguity range, one of the comparator outputs is false, and thus the ambiguity indicator is false, i.e. the decoded result is not "ambiguous".

The soft-decoder outputs $a_i(t)$ and $d_i(t)$ are fed to a decoding logic device 403 as illustrated in FIG. 4. This decoding logic device 403 uses the preliminary decoded values $d_i(t)$ and their associated ambiguity indicators $a_i(t)$ to approximate the GML rule. Specifically, the logic device 403 is designed so that the signals $a_i(t)$ and $d_i(t)$ are used to determine which sample timing index i corresponds to the optimal sampling point in time, which is the value of $\tau^{(k)}$ in Eq. (2). Given the timing offset estimate, the GML approach would output the ML estimate for this sample point. Thus, the present invention outputs the hard-decoded value $d_i(t)$ for the chosen timing index i.

An exemplary decoding rule designed to reduce the impact of timing uncertainty is given in Table 1. The first column simply labels the row number for future reference. The next three columns are possible values that the triplet of ambiguity signals can possess. The fifth column is the inferred optimal sample timing index. The sixth column is the hard-decoded output symbol. To keep the table manageable in size, the fifth and sixth columns are stated in terms of the hard-decoded values $d_i(t)$. An exhaustive listing of the $a_i(t)$ and $d_i(t)$ input combinations would yield a table with 64 rows.

TABLE 1

Decoding logic device output rule.

| row | $a_0$ | $a_1$ | $a_2$ | timing uncertainty estimate -- i | hard-decoded output |
|---|---|---|---|---|---|
| 1 | 0 | 0 | 0 | 1 | $d_1$ |
| 2 | 0 | 0 | 1 | 1 | $d_1$ |
| 3 | 0 | 1 | 0 | If $d_0 = d_2$, then i = 0 or i = 2. If $d_0 \neq d_2$, then i = 1. | If $d_0 = d_2$, then output $d_0$. If $d_0 \neq d_2$, then output $d_1$. |
| 4 | 0 | 1 | 1 | 0 | $d_0$ |
| 5 | 1 | 0 | 0 | 1 | $d_1$ |
| 6 | 1 | 0 | 1 | 1 | $d_1$ |
| 7 | 1 | 1 | 0 | 2 | $d_2$ |
| 8 | 1 | 1 | 1 | 1 | $d_1$ |

The essence of Table 1 is to determine which sample timing index i to use based primarily on the ambiguity indicators $a_i(t)$, secondarily on the hard-decoded values $d_i(t)$ when the ambiguity indicators are inconclusive, and thirdly on the prior assumption that the middle sample i=1 is nominally correct (i.e. no bias in the sample timing error). The table can be interpreted as follows:

When two samples are ambiguous and one is unambiguous (i.e. rows 4, 6, and 7), simply choose the sample timing index i which was declared unambiguous.

When all three samples are unambiguous (i.e. row 1), choose the middle sample i=1. In this case, all three choices are highly probably to be correct, so choose the middle one by default.

When all three samples are ambiguous (i.e. row 8), choose the middle sample i=1. In this case, all three options are ambiguous, so default to the "conventional" choice of the middle sample.

When two adjacent samples are unambiguous and one sample is ambiguous (i.e. rows 2 and 5), choose the middle sample i=1. Because two adjacent samples are unambiguous, that implies that the either (i) the first and middle samples are unambiguous or (ii) the middle and last samples are unambiguous. In either case, the middle sample is unambiguous, so that one is chosen based on the prior assumption that there is no bias in the sample timing error.

When the first and last samples are unambiguous and the middle sample is ambiguous (i.e. row 3), use the hard-decoded values to aid in the decision. In particular, choose the middle sample if the hard-decoded values of the first and last samples contradict, and choose the outer samples if the hard-decoded values of the first and last samples are the same. When the outer two samples are unambiguous and have opposite hard-decoded values, we are likely near the symbol edge and thus the decision rule defaults to choosing the middle sample. When the outer two samples have the same hard-decoded value, then it is likely that the middle sample was simply perturbed by noise to push it into the ambiguity region, and thus, we can take either of the outer samples.

Using the determined sample timing, the decoded symbol output of the decoding device 403 is taken as the hard-decoded sample value for the chosen time index i.

Those skilled in the art recognize that other logic tables similar to Table 1 can be produced by using the GML principle. For instance, some of the outputs in Table 1 can be changed without significantly affecting the performance of the inventive decoding unit. For example, consider the following:

Row 1: All the outputs are unambiguous. Because the received signal is continuous in nature, it is highly probable that all three hard-decoded samples are of the same value, i.e. $d_0(t)=d_1(t)=d_2(t)$. Stated differently, it is unlikely that the signal would experience an extreme change in value where it skips over the ambiguity region from one sample to the next. Thus, the timing estimate i can be made as any one of the three possible values without significant decoder performance degradation.

Row 2: Using the same signal continuity argument as stated for row 1 above, one can choose the timing estimate to be either i=0 or i=1 without significant decoder performance degradation since it is likely that $d_0(t)=d_1(t)$.

Row 3 (Case where $d_0=d_2$): Since $d_0=d_2$, it is equivalent to output $d_2$ instead of $d_0$. Thus, this change can be made with no effect on decoder performance.

Row 5: Using the same signal continuity argument as stated for row 1 above, one can choose the timing estimate to be i=1 or i=2 without significant performance degradation since it is likely that $d_1(t)=d_2(t)$.

Any combination of these changes could be made to Table 1 to simplify the implementation of the decoding logic. These and similar modifications are considered to be included as part of the present invention.

Second Exemplary Embodiment

Figure 6:
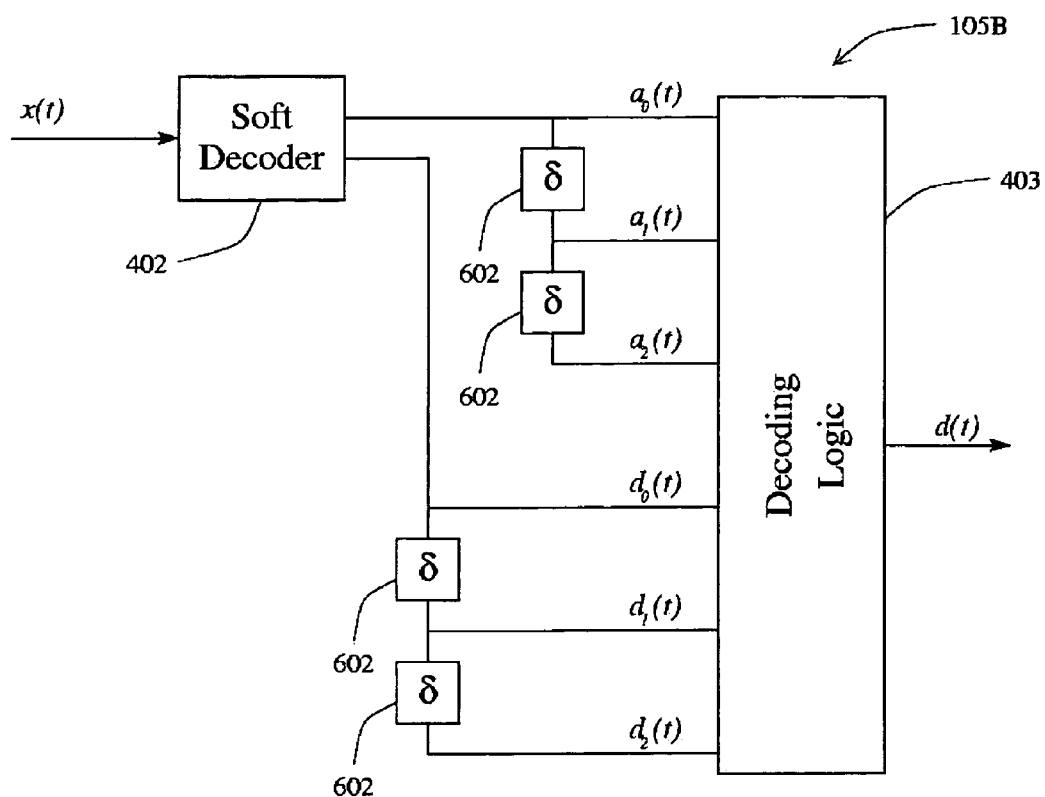
FIG. 6 is a block diagram of a deocoding unit that employs a single asynchronous soft-decoder according to one exemplary embodiment of the present invention.

Referring now to FIG. 6, it is sometimes advantageous to replace analog circuitry with functionally equivalent digital circuitry when possible. The primary reason for this replacement of analog processing is that while the functionality is theoretically the same in both situations, it is sometimes easier to maintain the signal integrity in the digital domain. Specifically, operations such as delays and splitting of the signal can distort the analog signal, thereby making a reliable implementation difficult in the analog domain. However, in the digital domain, the signal can be easily reshaped to remove minor distortions, and thereby implement the functionality with negligible degradation.

In FIG. 6, this digital embodiment of a decoding unit 105B is functionally equivalent to the exemplary embodiment illustrated in FIG. 4, but the exemplary embodiment of FIG. 6 reduces the amount of analog signal processing. Meanwhile, because of the functional equivalence of these two exemplary embodiments, the decoding logic given in Table 1 can be used for the exemplary embodiment of FIG. 6.

Compared to the exemplary embodiment of FIG. 4, the second exemplary embodiment of FIG. 6 has the three signal delays (and their associated signal splitting) transferred over to the digital domain. Thus, instead of producing soft-decoder outputs of three different delays of the signal x(t) as in the exemplary embodiment of FIG. 4, the exemplary embodiment of FIG. 6 applies a soft-decoder 402 directly to the received signal thereby avoiding any degradation of the received signal due to the analog splitting and delaying.

The soft-decoder outputs $a_0(t)$ and $d_0(t)$ are then split and delayed by digital delay elements 602 to yield the other soft-decoded samples $a_1(t)$, $a_2(t)$, $d_1(t)$, and $d_2(t)$. As previously mentioned, because the splitting and delays are in the digital domain, integrity of the signal can be more easily maintained in this second exemplary embodiment of FIG. 6 compared to the exemplary embodiment of FIG. 4 and thereby, the exemplary embodiment of FIG. 6 can be manufactured more easily in the presence of real-world circuit design challenges.

An additional advantage of the exemplary embodiment of FIG. 6 over the exemplary embodiment of FIG. 4 is that the former only requires a single soft-decoder 402 regardless of the number of signal delays desired whereas embodiment 105A in FIG. 4 requires a soft-decoder 402 for each sample taken during a symbol period. However, it should be noted that the soft-decoder 601 in the second decoding unit embodiment 105B in FIG. 6 is slightly different than the soft-decoder 402 in the first decoding unit embodiment 105A of FIG. 4. The two soft-decoders 402, 501 are identical except that the soft-decoder 602 of the second decoding unit embodiment 105B in FIG. 6 is asynchronous in operation. In other words, the comparator units 501A-501C and the logical AND-gate 504 in FIG. 5 are not driven by a clock but instead operate in a continuous manner.

Third Exemplary Embodiment

Although the first and second exemplary embodiments illustrated in FIGS. 4 and 6 are both presented with the primary target application being high-speed digital communications, they are equally applicable to lower-speed digital communications as well. However, in the lower-speed applications, there exist other ways of implementing the same functionality such as illustrated in FIG. 7.

Figure 7:
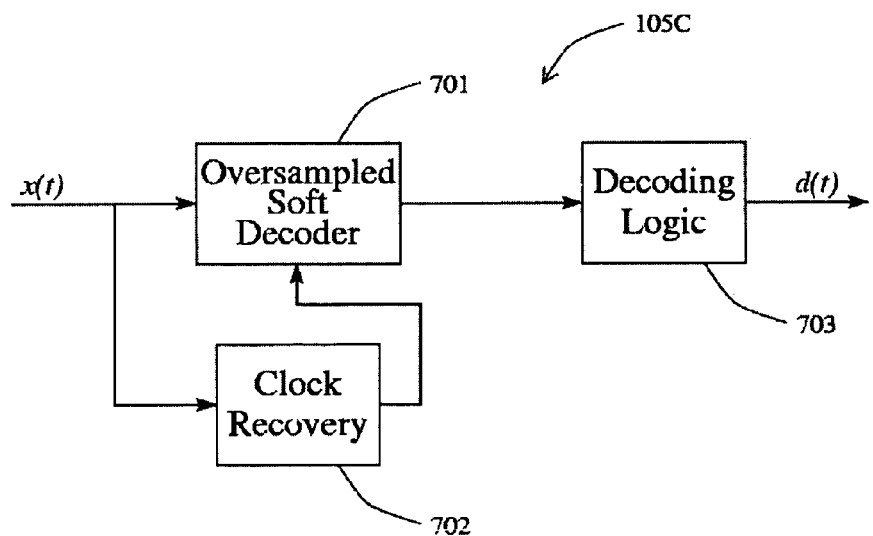
FIG. 7 is a block diagram of a decoding unit that employs a processor for lower data rate applications according to one exemplary embodiment of the present invention.

In particular, in FIG. 7, a third decoding unit 105C can comprise an oversampling analog-to-digital converter (ADC) 701 that can be used in place of the soft-decoders 402, 602 and associated delay elements (401, 402, and 602 for the exemplary embodiments of FIGS. 4 and 6). This ADC 701 may then feed these samples (either as a serial data stream at the oversampling data rate or a multiple of data streams at the symbol rate) to a microprocessor 703. The microprocessor 703 can be programmed to implement the decoding rule in Table 1 or one of its variants. Thus, the present invention can be realized at lower-speeds with readily available commercial components, such as the oversampling ADC 701, a clock recovery unit 702, and a programmable processor or logic device 703.

Exemplary Methods for Decoding Received Signals

The processes and operations described below with respect to all of the logic flow diagrams may include the manipulation of signals by a processor and the maintenance of these signals within data structures resident in one or more memory storage devices. For the purposes of this discussion, a process can be generally conceived to be a sequence of computer-executed steps leading to a desired result.

These steps usually require physical manipulations of physical quantities. Usually, though not necessarily, these quantities take the form of electrical, magnetic, or optical signals capable of being stored, transferred, combined, compared, or otherwise manipulated. It is convention for those skilled in the art to refer to representations of these signals as bits, bytes, words, information, elements, symbols, characters, numbers, points, data, entries, objects, images, files, or the like. It should be kept in mind, however, that these and similar terms are associated with appropriate physical quantities for computer operations, and that these terms are merely conventional labels applied to physical quantities that exist within and during operation of the computer.

It should also be understood that manipulations within the computer are often referred to in terms such as creating, adding, calculating, comparing, moving, receiving, determining, identifying, populating, loading, executing, etc. that are often associated with manual operations performed by a human operator. The operations described herein can be machine operations performed in conjunction with various input provided by a human operator or user that interacts with the computer.

In addition, it should be understood that the programs, processes, methods, etc. described herein are not related or limited to any particular computer or apparatus. Rather, various types of general purpose machines may be used with the following process in accordance with the teachings described herein.

The present invention may comprise a computer program or hardware or a combination thereof which embodies the functions described herein and illustrated in the appended flow charts. However, it should be apparent that there could be many different ways of implementing the invention in computer programming or hardware design, and the invention should not be construed as limited to any one set of computer program instructions.

Further, a skilled programmer would be able to write such a computer program or identify the appropriate hardware circuits to implement the disclosed invention without difficulty based on the flow charts and associated description in the application text, for example. Therefore, disclosure of a particular set of program code instructions or detailed hardware devices is not considered necessary for an adequate understanding of how to make and use the invention. The inventive functionality of the claimed computer implemented processes will be explained in more detail in the following description in conjunction with the remaining Figures illustrating other process flows.

Certain steps in the processes or process flow described in all of the logic flow diagrams below must naturally precede others for the present invention to function as described. However, the present invention is not limited to the order of the steps described if such order or sequence does not alter the functionality of the present invention. That is, it is recognized that some steps may be performed before, after, or in parallel other steps without departing from the scope and spirit of the present invention.

Method for Decoding Received Signals—First Exemplary Embodiment

Referring now to FIG. 8, this figure is a logic flow diagram illustrating an exemplary method 800 for decoding received signals according to a first exemplary embodiment of the present invention as illustrated in FIG. 4.

Figure 2:
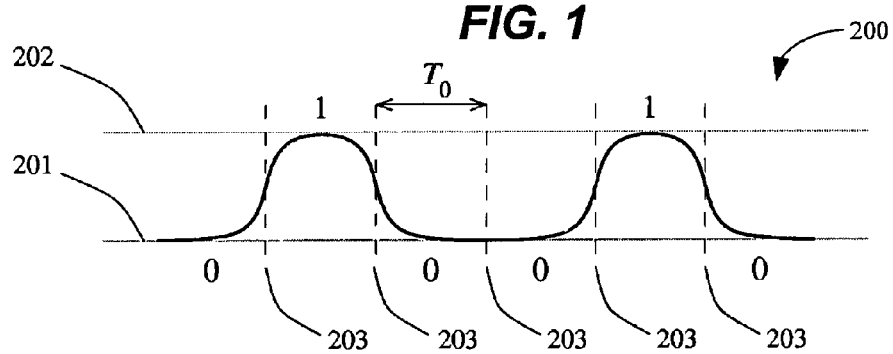
FIG. 2 is an exemplary binary on-off keyed signal with demarcations to indicate different symbols that can form an exemplary multilevel signal.
Figure 3:
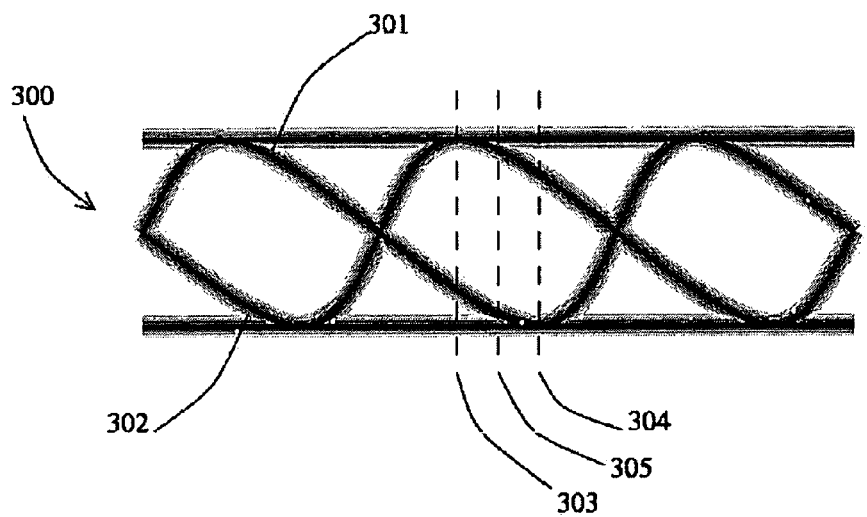
FIG. 3 is an illustration of an exemplary eye-diagram of a binary optical signal suffering from chirp distortion with exemplary sample timing points.

The steps of method 800 generally correspond with the decoding unit 105A illustrated in FIG. 4. Step 805 is the first step of method 800 in which a communicated signal such as the signal 200 illustrated in FIG. 2 can be received. Next, in step 810 the received signal is divided into a plurality of equivalent signals.

In step 815, the one or more divided signals are each delayed by a different amount of time. Step 815 generally corresponds to the delay stages or elements 401 of FIG. 4.

In step 820, a plurality of ambiguity indicators and preliminary decoded values corresponding to the divided signals are determined. Step 820 generally corresponds to the digital outputs of the soft-decoders 402 of FIG. 4. The ambiguity indicator corresponds to signal $a_i(t)$ while the preliminary decoded value corresponds to signal $d_i(t)$. As noted above, signal $a_i(t)$ is an ambiguity indicator signifying the degree of confidence that the soft-decoder 402 has in its decision $d_i(t)$. In other words, the signal $a_i(t)$ conveys how likely $d_i(t)$ correctly represents the current symbol.

In step 825, a sample timing index is determined from the ambiguity indicators and preliminary decoded values. This step generally corresponds with Table 1 and how the sample timing index i is derived from the ambiguity indicators and their relationships to one another along with the preliminary decoded values. In step 830, the symbol output corresponding to the determined index and preliminary decoded value is identified. This step generally corresponds with Table 1 and the last column of values that are used based on the determined sample timing index i.

Method for Decoding Received Signals—Second Exemplary Embodiment

Referring now to FIG. 9, this figure is a logic flow diagram illustrating an exemplary method 900 for decoding received signals according to a second exemplary embodiment of the present invention as illustrated in FIG. 6.

The steps of method 900 generally correspond with the decoding unit 105B illustrated in FIG. 6. Step 905 is the first step of method 900 in which a communicated signal such as the signal 200 illustrated in FIG. 2 can be received. Next, in step 910, an ambiguity indicator and a preliminary decoded value corresponding to the received signal are determined.

Step 910 generally corresponds to the digital outputs of the single, asynchronous soft-decoder 402 of FIG. 6. The ambiguity indicator corresponds to signal $a_i(t)$ while the preliminary decoded value corresponds to signal $d_i(t)$. As noted above, signal $a_i(t)$ is an ambiguity indicator signifying the level of confidence that the soft-decoder 402 has in its decision $d_i(t)$. In other words, the signal $a_i(t)$ conveys how likely $d_i(t)$ correctly represents the current symbol.

In step 915, the ambiguity indicator signal and decoded value are divided into a plurality of signals. Next, in step 920, the one or more divided signals are each delayed by a different amount of time. Step 920 generally corresponds to the delay stages or digital delay elements 602 of FIG. 6.

In step 925, a sample timing index is determined from the delayed ambiguity indicators and the associated preliminary decoded values. This step generally corresponds with Table 1 and how the sample timing index i is derived from the ambiguity indicators and their relationships to one another along with the preliminary decoded values. In step 930, the symbol output is the preliminary decoded value corresponding to the determined index. This step generally corresponds with Table 1 and the last column of values that are used based on the determined sample timing index i.

Method for Decoding Received Signals—Third Exemplary Embodiment

Referring now to FIG. 10, this figure is a logic flow diagram illustrating an exemplary method 1000 for decoding received signals according to a third exemplary embodiment of the present invention as illustrated in FIG. 7.

The steps of method 1000 generally correspond with the decoding unit 105C illustrated in FIG. 7. Step 1005 is the first step of method 1000 in which a communicated signal such as the signal 200 illustrated in FIG. 2 can be received. Next, in step 1010, a clock signal is determined from the received signal. Step 1010 generally corresponds with the clock recovery unit 702 of FIG. 7.

In step 1020, the received signal is converted into the digital domain by taking multiple samples based upon the determined clock signal. Step 1020 generally corresponds with the oversampled soft-decoder or ADC 701 as illustrated in FIG. 7.

In step 1025, a sample timing index is determined from delayed ambiguity indicators and the associated preliminary decoded values. This step generally corresponds with Table 1 stored in the microprocessor 703 of FIG. 7 and how the sample timing index i is derived by the processor from the ambiguity indicators and their relationships to one another along with the preliminary decoded values. In step 1030, the symbol output is the preliminary decoded value corresponding to the determined index. This step generally corresponds with Table 1 and the last column of values that are used based on the determined sample timing index i.

It should be understood that the foregoing relates only to illustrate the embodiments of the present invention, and that numerous changes may be made therein without departing from the scope and spirit of the invention as defined by the following claims.

What is claimed is:

1. A decoding unit for decoding a received signal comprising:
a plurality of soft-decoders, each soft-decoder operable to sample the received signal at a different time within a symbol period and to output two values for each sample, the first value comprising a preliminary decoded value and the second value comprising an ambiguity indicator; and
a logic device coupled to the each of the soft-decoders, for determining a decoded value for each symbol based on one or more preliminary decoded values and ambiguity indicators.

2. The decoding unit of claim 1, wherein the soft-decoders are substantially identical to one another.

3. The decoding unit of claim 1, wherein each soft-decoder comprises:
a first comparator with inputs comprising the received signal and a first reference voltage;
a second comparator with inputs comprising the received signal and a second reference voltage; and
a third comparator with inputs comprising the received signal and a third reference voltage.

4. The decoding unit of claim 1, wherein each soft-decoder comprises a plurality of comparators and one or more logical AND gates.

5. The decoding unit of claim 1, further comprising a plurality of delay elements coupled to the soft-decoders.

6. The decoding unit of claim 1, further comprising a plurality of delay elements coupled to the soft-decoders, each delay element delaying the received signal by a different amount.

7. The decoding unit of claim 1, further comprising a plurality of delay elements coupled to the soft-decoders, each delay element delaying a clock signal by a different amount.

8. A decoding unit for decoding a received signal comprising:
an asynchronous soft-decoder that continuously samples the received signal and produces a decoded output signal and an ambiguous indicator signal;
a plurality of first delay elements coupled to a first soft-decoder, each first delay element generating a different delay relative to another first delay element and producing an ambiguity indicator from the ambiguous indicator signal;
a plurality of second delay elements coupled to a second soft-decoder output, each second delay element generating a different delay relative to another second delay element and producing a preliminary decoded output from the decoded output signal; and
a logic device coupled to the each of the first and second delay elements, for determining a decoded value based on one or more of the preliminary decoded outputs and ambiguity indicators.

9. The decoding unit of claim 8, wherein the soft-decoder comprises:
a first comparator with inputs comprising the received signal and a first reference voltage;
a second comparator with inputs comprising the received signal and a second reference voltage; and
a third comparator with inputs comprising the received signal and a third reference voltage.

10. The decoding unit of claim 8, wherein the soft-decoder comprises a plurality of comparators and one or more logical AND gates.

11. A decoding unit for decoding a received signal comprising:
an analog-to-digital converter for sampling the received signal faster than once every symbol period of the received signal and outputting for each sample a first value comprising a preliminary decoded value and a second value comprising an ambiguity indicator; and
a processor coupled to the converter for grouping a subset of sampled first and second values derived from the single symbol period, for examining the subset of sampled first and second values and determining a first value closest to an optimum sampling time based on a principle of generalized maximum likelihood, for decoding the first value closest to the optimum sampling time and outputting that decoded first value as the decoded symbol.

12. The decoding unit of claim 11, further comprising a clock recovery unit coupled to the converter for providing a clock signal.

13. The decoding unit of claim 11, wherein the processor calculates the first value closest to the optimum sampling time by:
computing an absolute difference between each first value and a nearest level corresponding to a decoded symbol;
finding a first value which has a smallest absolute difference from the subset of first values; and
taking the first value with the smallest absolute difference as the first value closest to the optimum sampling time.

14. A method for decoding a received signal comprising:
receiving a signal;

estimating an optimal timing offset on a symbol-by-symbol basis; and decoding the received signal using generalized maximum likelihood estimation with the estimated optimal timing offset, wherein estimating an optimal timing offset on a symbol-by-symbol basis comprises generating an ambiguity indicator and a preliminary decoded value for a sample.

15. A method for decoding a received signal comprising:

receiving a signal;

estimating an optimal timing offset on a symbol-by-symbol basis; and decoding the received signal using generalized maximum likelihood estimation with the estimated optimal timing offset, wherein estimating an optimal timing offset on a symbol-by-symbol basis comprises:

dividing the received signal into a plurality of received signals; and delaying each of the plurality of received signals by different amounts of time.

16. A method for decoding a received signal comprising:

receiving a signal;

estimating an optimal timing offset on a symbol-by-symbol basis; and decoding the received signal using generalized maximum likelihood estimation with the estimated optimal timing offset, wherein estimating an optimal timing offset on a symbol-by-symbol basis comprises:

determining a clock signal from the received signal;

taking multiple samples of the received signal in accordance with the clock signal; and converting the received signal into the digital domain based on the multiple samples.

17. A method for decoding a received signal comprising:

receiving a signal;

estimating an optimal timing offset on a symbol-by-symbol basis; and decoding the received signal using generalized maximum likelihood estimation with the estimated optimal timing offset, wherein decoding the received signal using generalized maximum likelihood estimation with the optimal timing offset comprises determining a sample timing index from one or more ambiguity indicators.

18. A method for decoding a received signal comprising:

receiving a signal;

estimating an optimal timing offset on a symbol-by-symbol basis; and decoding the received signal using generalized maximum likelihood estimation with the estimated optimal timing offset, wherein decoding the received signal using generalized maximum likelihood estimation with the optimal timing offset comprises identifying a symbol that corresponds to a selected timing index.

19. The method of claim 18, wherein estimating an optimal timing offset on a symbol-by-symbol basis comprises:

dividing an ambiguity indicator signal and a preliminary decoded value signal derived from the received signal; and delaying each ambiguity indicator signal and each preliminary decoded value signal by different amounts of time.

* * * * *